(12) United States Patent
Keenihan et al.

(10) Patent No.: US 8,377,358 B2
(45) Date of Patent: Feb. 19, 2013

(54) METHOD FOR ENCAPSULATING THE EDGE OF A FLEXIBLE SHEET

(75) Inventors: James R. Keenihan, Midland, MI (US); Todd M. Clarey, Bay City, MI (US)

(73) Assignee: Dow Global Technologies LLC, Midland, MI (US)

( * ) Notice: Subject to any disclaimer, the term of this patent is extended or adjusted under 35 U.S.C. 154(b) by 119 days.

(21) Appl. No.: 12/989,747

(22) PCT Filed: May 1, 2009

(86) PCT No.: PCT/US2009/042507
§ 371 (c)(1),
(2), (4) Date: Jan. 5, 2011

(87) PCT Pub. No.: WO2009/137351
PCT Pub. Date: Nov. 12, 2009

(65) Prior Publication Data
US 2011/0101564 A1    May 5, 2011

Related U.S. Application Data

(60) Provisional application No. 61/050,341, filed on May 5, 2008.

(51) Int. Cl.
*B29C 45/14* (2006.01)
(52) U.S. Cl. .................................. 264/275; 264/328.12
(58) Field of Classification Search ........................ None
See application file for complete search history.

(56) References Cited

U.S. PATENT DOCUMENTS

| | | | | |
|---|---|---|---|---|
| 3,363,040 A | * | 1/1968 | Aoki | 264/278 |
| 3,397,814 A | * | 8/1968 | Zackheim | 220/792 |
| 4,695,420 A | * | 9/1987 | Grawey et al. | 264/265 |
| 4,781,012 A | * | 11/1988 | Reil et al. | 53/452 |
| 4,826,598 A | | 5/1989 | Cain | |
| 5,897,823 A | * | 4/1999 | Davis et al. | 264/266 |
| 6,300,555 B1 | | 10/2001 | Kondo et al. | |
| 6,342,176 B2 | | 1/2002 | Goto et al. | |
| 6,926,858 B2 | | 8/2008 | Cree | |
| 7,462,077 B2 | | 12/2008 | Chow et al. | |
| 7,713,089 B2 | | 5/2010 | Faust et al. | |
| 2001/0042946 A1 | | 11/2001 | Schlieber et al. | |
| 2002/0171169 A1 | | 11/2002 | Chuang | |
| 2007/0273019 A1 | | 11/2007 | Huang et al. | |
| 2010/0180523 A1 | | 7/2010 | Lena et al. | |

FOREIGN PATENT DOCUMENTS

| | | |
|---|---|---|
| EP | 0442152 A1 | 8/1991 |
| EP | 0677369 A1 | 10/1995 |
| EP | 1548846 A2 | 6/2005 |
| JP | 63067131 A | 3/1988 |
| JP | 1056516 A | 3/1989 |
| JP | 3-199022 A | 8/1991 |
| WO | 2009/137347 | 11/2009 |
| WO | 2009/137348 | 11/2009 |

(Continued)

OTHER PUBLICATIONS

International Search Report for PCT/US2009/042507 dated Jan. 11, 2010.

(Continued)

*Primary Examiner* — Edmund H. Lee
(74) *Attorney, Agent, or Firm* — Dobrusin & Thennisch PC

(57) ABSTRACT

The present invention is premised upon an inventive method of producing an over-molded edge portion on a flexible substrate, wherein the edge portion is void of open areas due to support devices in the mold cavity.

8 Claims, 2 Drawing Sheets

FOREIGN PATENT DOCUMENTS

| | | |
|---|---|---|
| WO | 2009/137352 | 11/2009 |
| WO | 2009/137353 | 11/2009 |

OTHER PUBLICATIONS

Japanese Office Action in Japanese application No. 2011-507678 based on same PCT application dated Jun. 26, 2012.

Chinese 1st Office Action in Chinese application No. 200980115960 based on same PCT application dated Nov. 17, 2011.

Chinese 2nd Office Action in Chinese application No. 200980115960 based on same PCT application dated Mar. 19, 2012.

Korean 1st Office Action in Korean application No. 10-2010-7027212 based on same PCT application dated Jun. 7, 2012.

\* cited by examiner

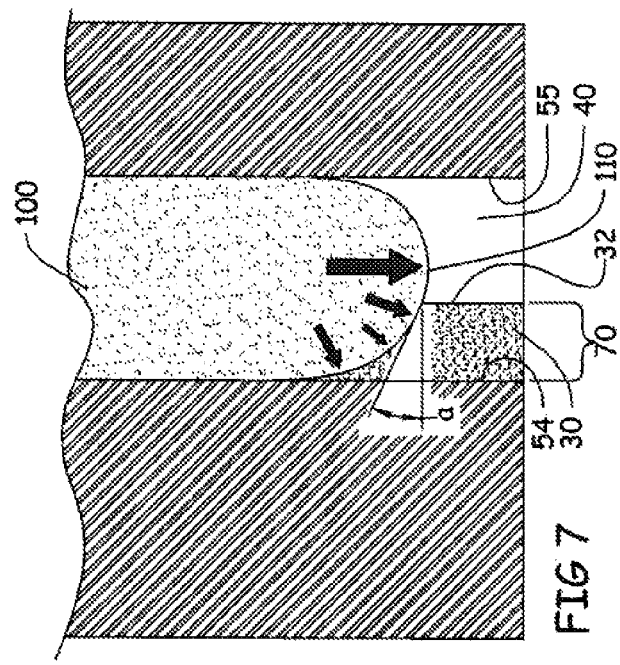
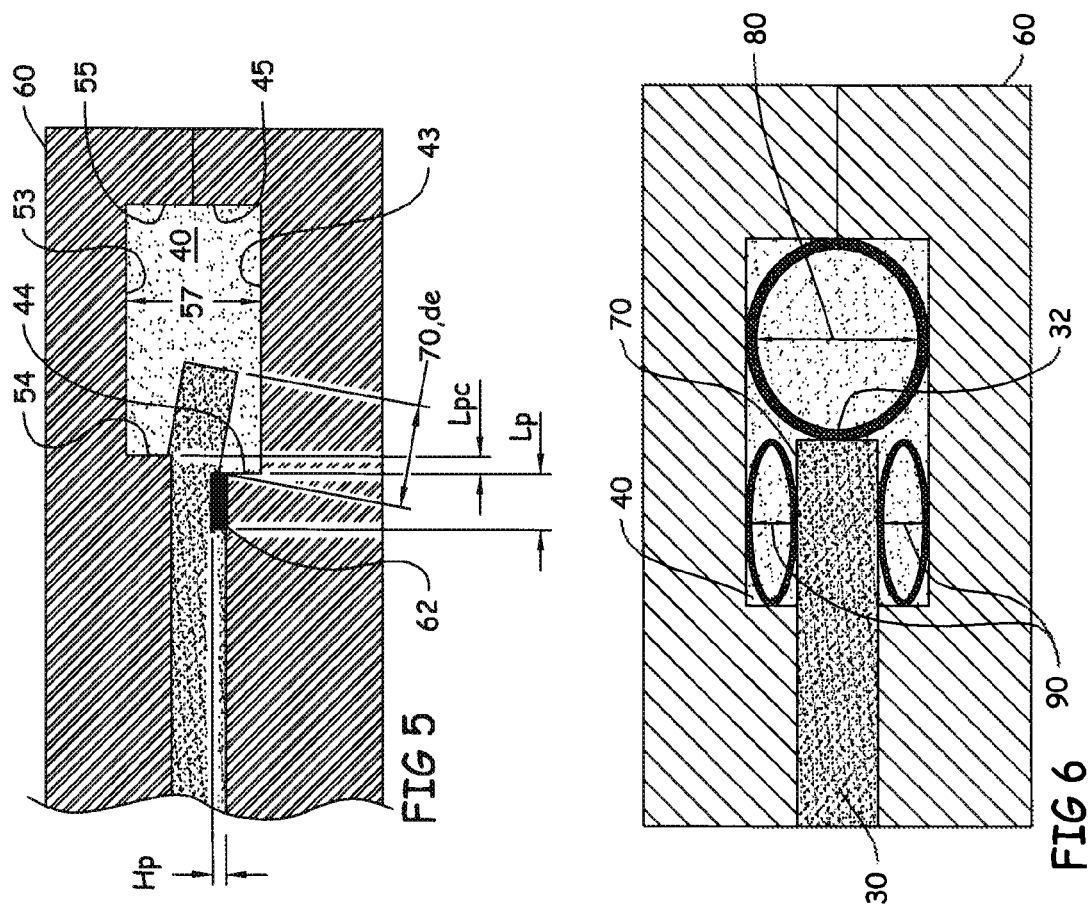

METHOD FOR ENCAPSULATING THE EDGE OF A FLEXIBLE SHEET

CLAIM OF BENEFIT OF FILING DATE

The present application claims the benefit of the filing date of PCT Application Serial No. PCT/US2009/042507 (filed May 1, 2009) (Published as WO 2009/137351); and U.S. Provisional Application Ser. No. 61/050,341 (filed May 5, 2008), the contents of which are hereby incorporated by reference in their entirety.

This invention was made with U.S. Government support under contract DE-FC36-07G017054 awarded by the Department of Energy. The U.S. Government has certain rights in this invention.

FIELD OF THE INVENTION

The present invention relates to an improved method for encapsulating the edge of a flexible sheet, more particularly by encapsulating a flexible sheet via an over molding process.

BACKGROUND

Generally, efforts to improve the encapsulation of edges of flexible sheets have taken many forms over the years. One type of flexible sheet that is of particular interest is photovoltaic cell assemblies. These photovoltaic ("PV") cell assemblies generally start with laminates in which additional features are attached with secondary methods to form a photovoltaic device. Typically, the entire PV cell assembly is either sealed in a box or bonded to a frame. It is preferred to at least have the edges of the PV cell assembly protected from environmental conditions such as moisture or other physical conditions such as mechanical loading (e.g. wind, debris, or the like).

For PV cell assemblies that are used in PV devices that are placed on building structures (e.g. roof shingles or facades, sometimes called building integrated photovoltaics "BIPV"), it is also may be important to keep the geometric shape and dimension of the PV device in a certain range. In the case of BIPV, the PV devices can work best with existing roofing materials if they mimic these existing materials. In the case of a BIPV shingle, it would ideally be matched in thickness, ability to conform to the roof deck.

Combining these features and the traits previously mentioned, into a device presents challenge. One contemplated method of integrating these features is with over-molding the PV cell assembly with the injection molding process. This process has its own challenges in working with the PV cell systems (laminates) common to solar. It is desirable to keep the over-molded area as small as possible, so as to minimize the inactive area of the PV module. The desired small area for the inactive area presents challenges with adhesion and attachment to the laminate structure. To obtain a minimum inactive area, it is desirable to mold on both sides of the laminate for increased bond area, environmental protection and mechanical protection. However, existing injection molding principles for over-molding enforce that the laminate should be against the mold cavity such that the high pressure process does not move the laminate to an undesirable location, In this case, using traditional methods, only a single side of the laminate structure would be bonded to the over-mold material.

This difficulty is compounded further in the case of a flexible laminate mimicking a traditional flexible shingle. Injection molding on both sides of a flexible laminate is generally accomplished with location features. The laminate is firmly held with these features such that the pressure of the polymer cannot move it. The relatively high pressure of the molten polymer will work to force the laminate to one of the cavity walls. This is due to what is commonly referred to as "fountain" flow. Fountain flow describes how the polymer flow is greatest at the center of the mold cavity with little or no flow at the cavity walls. As the flow enters un-filled regions of the mold, the flow splits in a "fountain", such that half of the flow moves towards each of the corresponding walls. At the wall, the polymer is not flowing, but freezing due to the cooler metal temperature. It is through this process that most insert molding of flexible inserts is controlled, and which results in the flexible laminate being forced to one of the cavity walls.

For this reason, it is usually desirable in processing to have the laminate insert on one side of the mold. If it is not, it will require sufficiently stiff locating pins or guides. For bond strength and laminate edge sealing, greater effectiveness could be achieved if the polymer was on both sides of the laminate.

Further compounding this problem, it is commonly desirable for the product to be flat on the back side such that it can be sealed to the roof deck as is the case with traditional shingles. This suggests that all over-molding should be on the top surface of the shingle only. This side of the shingle is generally covered with a low surface energy material, such as ETFE or glass. This low surface energy material is needed to prevent dust and moisture fouling which will block sunlight and reduce the power of the device. These same anti-fouling traits make it very difficult to bond an injection moldable material to the top surface. This also results in reduction of surface area efficiency due to adding of tie-layers and their tolerances. It would be much more desirable to obtain proper bond strength and encapsulation through utilizing surface area on the inactive side of the device.

Through use of the over-molding process on both sides of the device, improved bond strength and edge sealing can be obtained without sacrificing active PV area. The injection molding process can then be used to further improve the functionality of the device by providing a means for locating the BIPV with respect to other roofing components and encapsulation of electrical devices such that traditional connectors, wire leads, junction boxes, and diodes can be incorporated into the device as integrated components.

The problem is to develop an over-molding process that places thermoplastic on both sides of a laminated PV cell assembly, in order to seal and protect the cell edges, (does not force the laminate to the edge of the mold) and does not require the use of pins or guides to suspend the laminate in the center of the tool cavity. In some cases, it is preferred that the process produces a PV device that is flat on the back (roof side) of the device, thereby requiring an offset centering of the laminate in the mold cavity.

Although the above section has focused on PV cells and PV devices, it is contemplated that the invention described below is applicable to any flexible sheet (single or multilayer) that one may want to encapsulate.

Among the literature that may pertain to this technology include the following patent documents: EP677369A1; U.S. Pat. No. 7,462,077; U.S. Pat. No. 6,926,858; U.S. Pat. No. 6,342,176; U.S. Pat. No. 4,826,598; US Patent Publication 2002/0171169; US Patent Publication 2001/0042946; and U.S. Provisional Application Nos. 61/050,341 (filed 5 May 2008); 61/098,941 (filed 22 Sep. 2008); 61/149,451 (filed 3 Feb. 2009), and PCT Applications filed concurrently herewith Ser. No. PCT/US2009/42496 published as WO 2009/137348; Ser. No. PCT/US20 US09/42523 published as WO 2009/

137353; and Ser. No. PCT/US2009/42522 published as WO 2009/137352 filed concurrently with the present application, all incorporated herein by reference for all purposes.

SUMMARY OF THE INVENTION

The present invention is directed to one such solution, and particularly is directed to a method of encapsulating both sides of the edge of a flexible laminate or sheet using the injection molding process. By designing the flexible laminate or sheet, mold cavity, and injection system as described herein, the polymer flow will result in minimal force imbalances between the opposing sides of the flexible laminate or sheet. The balance of these forces results in polymer on both sides of the flexible article. This can be accomplished using the described process instead of rigid pins or structures firmly holding the flexible article as are common to the industry.

Accordingly, pursuant to a first aspect of the present invention, there is contemplated a method of producing an over-molded article (e.g. a flexible laminate or sheet) including the steps of: providing a substrate to be over-molded, wherein the substrate has a Young's modulus of 150 MPa to 1500 MPa, has an upper surface, lower surface, and a side surface connecting the upper and lower surface, and a centerline equidistant from the upper and lower surfaces; providing a mold with a mold cavity including a first and a second section defining a cavity, the mold cavity having an upper wall, a lower wall and an inner and outer side wall interconnected therebetween, a cavity height defined by the distance between the upper wall and the lower wall, wherein the mold is essentially void of any nesting device inside the mold cavity to support the substrate; placing and aligning an edge of the substrate onto the first section of the mold cavity such that an edge portion of the substrate, defined by a distance de, a length dl, and a thickness dh, is disposed within the mold cavity and the edge portion is disposed in the mold cavity at a distance dw from the upper or lower walls, wherein dw is at least 10% of the cavity height at any point on the side surface of the substrate; closing the second section of the mold cavity, sandwiching the substrate therebetween, wherein the edge portion of the substrate is unsupported and protrudes into the mold cavity; injecting a flowable polymer into the mold cavity creating a polymer flow until the cavity is substantially filled with the flowable polymer and the edge portion is entirely sealed by the polymer; holding the mold closed until the polymer solidifies; opening the mold sections; and removing the over-molded article.

The first aspect of the present invention may be further characterized by one or any combination of the features described herein, such as the mold cavity is further defined to have a clear zone and a substrate zone, the polymer flow is further defined as having a flow front, wherein the flow front at least partially fills the clear zone before filling the substrate zone; the mold cavity is defined by a cavity width which is the distance from the inner and outer side walls, a cavity height, and a cavity length; distance de is at most 0.5 times the cavity width and length dl is at least 2 times the cavity width and thickness dh is at most 0.75 times the cavity height; the flow front has a front surface that is angled between the clear zone and substrate zone at an angle α, wherein α has a value between about 5° and 60°; the thickness dh is from about 1.0 to 5.0 mm; the distance de is from about 2.0 to 10.0 mm; the flowable polymer has a viscosity of less than 150 Pa-s at 10,000 sec-1 as measured by ASTM D3835-2002; the mold includes a projection; a pressure gradient of the flowable polymer above and below the edge portion is less than what is required to force the edge portion to either of the cavity walls; the pressure gradient is less than 1400 KPa.

DESCRIPTION OF THE DRAWINGS

FIGS. 5 & 6 are another side view of an illustrative example of a portion of the mold of FIG. 3.

FIG. 7 is a top view of the mold of FIGS. 3 and 5, including a polymer flow.

DETAILED DESCRIPTION OF THE PREFERRED EMBODIMENT

Figure 1:
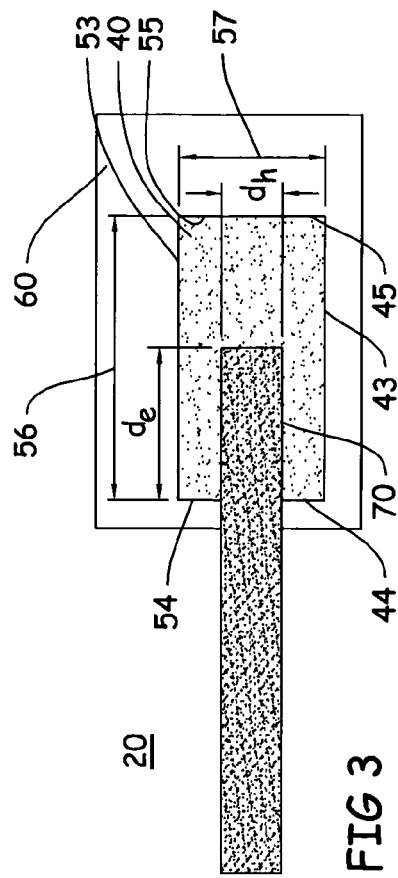
FIG. 1 is a side view of one illustrative example of an over-molded edge portion according to the present invention.
Figure 2:
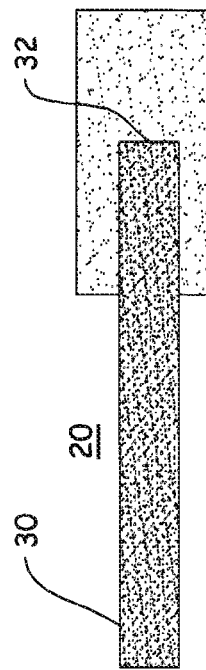
FIG. 2 is a side view of another illustrative example of an over-molded edge portion according to the present invention.

The invention is a method for encapsulating or over-molding the edge of a flexible sheet or laminate ("substrate" 30), creating an over-molded article 20, as shown in FIGS. 1 and 2. By controlling some or all of the substrate flexibility, substrate dimensions and geometry, mold cavity 40 dimensions, flow directions, and processing (and therefore polymer viscosity), the substrate can be encapsulated on its edges (e.g. edge portion 70) without the use of nesting features (e.g. locating pins or rigid inserts) to support the substrate within the mold cavity 40. In the sections below, the substrate 30, the mold 60, and the molding process are described further.

Flexible Laminate (Substrate)

It is contemplated that the substrate 30, at least in the area that is to be encapsulated, has a minimum stiffness (e.g. Young's modulus) to prevent initial deflection onto the cavity walls when the flowable polymer first makes contact with it. This stiffness should be sufficient to break the "fountain flow" of the polymer as it comes in contact with the substrate 30. In a preferred embodiment, the substrate 30 will have a Young's modulus of at least about 100 Mega Pascal (MPa) and at most about 2000 MPa, more preferably at least about 150 MPa and at most about 1500 MPa, most preferably at least about 250 MPa and at most about 600 MPa.

It is contemplated that the substrate 30 may have a unitary structure (e.g. made up of a single layer) or may be a multi-layered structure that is joined together (e.g. a composite sheet) with a thickness $d_h$. In one preferred embodiment, the substrate 30 is a multi-layer composite that is formed from at least some of the layers (e.g. protective layers, photovoltaic cell assembly, or any combination thereof) as described in U.S. Provisional Application No. 61/050,341 (filed 5 May 2008), hereby incorporated by reference for all purposes. In a most preferred embodiment, the substrate is an assembly of layers that are preassembled (e.g. laminated or otherwise at least loosely bonded together and will not significantly separate due to the pressures of the over-molding process). The substrate layers may include some or all of: thin films or deformable materials, with significant plastic or elastic elongation such as thermoplastics and themosets, synthetic and natural rubbers, films, elastomers, glass plate or polymeric sheets or "Plexiglas", silicon, Copper indium gallium selenide (CIGS) materials, ethylene-vinyl-acetate, metal foils, thermoplastic polyolefin ("TPO"), polyvinyl chloride, polyolefins, polyester amides, polysulfone, acetel, acrylic, polyvinyl chloride, nylon, polycarbonate, phenolic, polyetheretherketon, polyethylene terephthalate, epoxies, and including glass and mineral filled composites or any combination thereof. Again, wherein whatever the substrate composition may be, the substrate 30 exhibits the range of stiffness characteristics described above.

Mold

It is contemplated that a mold 60 may be utilized in conjunction with the above described substrate to introduce a band of polymeric material about an edge portion of the substrate. The mold 60, as shown in FIGS. 3-6, may be further defined as including a mold cavity 40. The cavity 40 may include at least a first and a second section 42, 52 defining the cavity 40. The first section 42 having a lower wall 43, a first inner wall 44 and a first outer wall 45. The second section 52 having an upper wall 53, a second inner wall 54 and a second outer wall 55. The cavity height 57 may be defined by the distance between the upper wall 53 and the lower wall 43. The cavity width 56 may be defined as the lesser of the distances from the inner and outer side walls 44, 45 and 54, 55. The cavity 40 may also include locally higher and wider sections (not shown) for features such as ribbing or other desired features. It is also contemplated that the mold 60 is essentially void of any nesting device (e.g. fixed or otherwise) inside the mold cavity 40 to support the substrate 30.

The mold 60 may be constructed of any number of materials, such as tool steel, beryllium-copper, mild steel, aluminum, nickel, epoxy, or any combination thereof. The mold may be plated or grained to produce the desired surface finish on the finished article. The mold 60 may contain cooling means (e.g. waterlines), not shown, or heating means, not shown, depending on the molding process desired (e.g. cold molding or hot molding). The mold 60 may include slides or actions (pieces of metal the injection molding tool that move so that the part may be released from the mold), not shown, to produce features that would otherwise create what is known as a die-lock condition. It may also include ejection pins to aid in the ejection of the article or other devices known in the art, not shown, of injection mold tooling.

Projection

Figure 4:
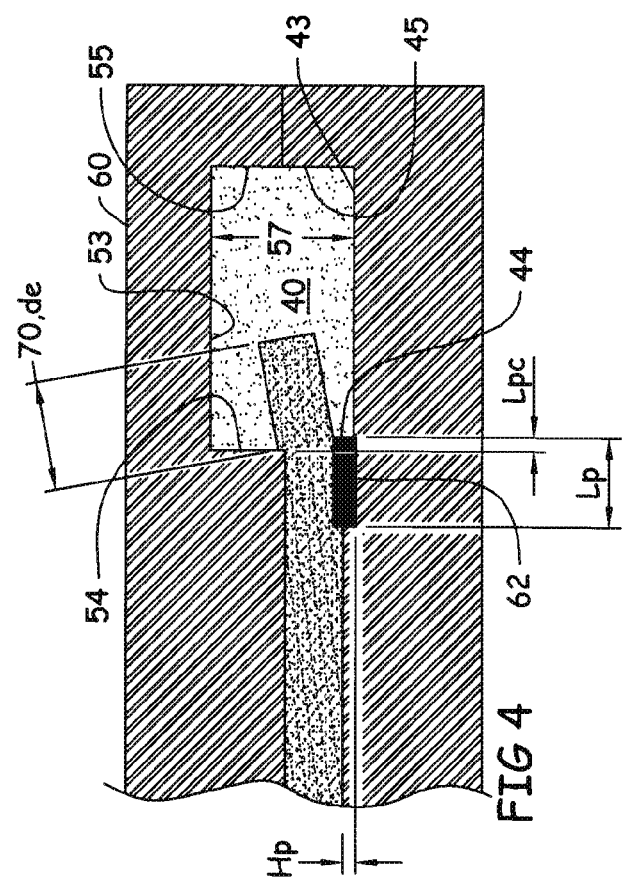
FIG. 4 is a side view of an illustrative example of a portion of the mold for producing the article of FIG. 2.

It is contemplated that the mold 60 may include a projection 62 or series of projections, for example as shown in FIGS. 4-5. The projection 62 may provide a sealing aid and/or geometric location functionality for the substrate 30. Sealing functionality may be provided by compressing the substrate over the projection distance Lp and a projection height Hp such that the compression forces induced by the tooling are higher than the pressures of the molten polymer, thereby preventing molten polymer from entering the area around the projection. The shape of the compression zone is shown in a rectangular section, but may be constructed as a triangular (tapered) section, cylindrical (round) section, or any other projection compressing the laminate. Alternately, this compression may be created over the entire substrate surface, in which case the projection height Hp is zero. It is contemplated that the projection 62 coextensive with either the first or second inner walls 44, 54 or both (shown in Figs. as coextensive with the first inner wall 44). In a preferred embodiment, Hp ranges from about 0 to 0.5 times dh and Lp ranges from about 0 to about 30 times dh, most preferably Hp ranges from about 0.5 to 0.2 times dh and Lp ranges from about 5 to about 10 times dh.

Geometric location functionality may be provided by inducing stresses or moving the centerline of the compressed substrate such that it changes the location of the edge portion 70 inside the tooling cavity 40 (e.g. edge portion 70 is bent towards or away from the upper or lower walls of the mold). It is contemplated that geometric location may be influenced by changing the projection height Hp length Lp and location Lpc. As shown in the Figures and in a preferred embodiment, the projection location Lpc may be about 1.0 times the substrate 30 thickness $d_h$, more preferably within about 0.5 times $d_h$, most preferably within about 0.2 times $d_h$ thereof.

Molding Process

In general, it can be said that the injection molding process, and in particular, the process of over-molding a relatively stiff article (or substrate) (e.g. an article with a Young's modulus greater than 1500 MPa) is well known in the art. It is believed that the over-molding of edge portions of relatively flexible articles (e.g. an article with a Young's modulus of less than 1500 MPa) has required at least a combination of extremely low cavity pressures (e.g. pressures below about 5 bar) or at least local nesting features (e.g. nesting pins or features that prevent full encapsulation of the edge portion) that support the articles close to the edge (within the mold cavity). In the case of standard injection molding cavity pressures (e.g. about 100 bar to about 2000 bar) it is believed that even more of these mentioned nesting features are required to over-mold the edge of the flexible article.

Some of the other known injection molding processes that this inventive method may apply to can include: Co-injection (sandwich)molding; Fusible(lost, soluble)core injection molding; Gas-assisted injection molding; In-mold decoration and in mold lamination; Injection-compression molding; Lamellar (microlayer) injection molding; Microinjection molding; Microcellular molding; Multiple live-feed injection molding; Powder injection molding; Push-Pull injection molding; Reaction injection molding; Resin transfer molding; Rheomolding; Structural foam injection molding; Structural reaction injection molding; Vibration gas injection molding; Water assisted injection molding; Rubber injection; and Injection molding of liquid silicone rubber.

The present invention can alleviate the need for the use of aforementioned nesting features and relatively low cavity pressures. Surprisingly, it with the proper cavity 40 designs and placement of the edge portion in the cavity, a full encapsulation of the edge portion 70 may be achieved, without the need for nesting features or low cavity pressures.

Figure 3:
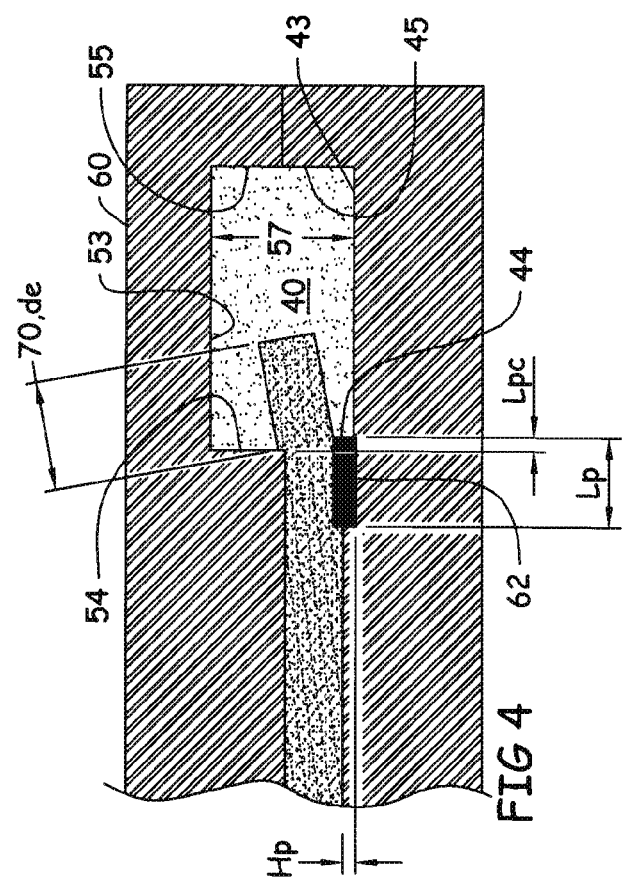
FIG. 3 is a side view of an illustrative example of a portion of the mold for producing the article of FIG. 1.

As shown in FIG. 3, the placement of the edge portion 70 of the flexible substrate 30 in the cavity 40 (e.g. portion of the substrate to be encapsulated) is one preferred aspect of the inventive method. It is contemplated that the edge portion 70 of the substrate 30 may be defined as having a distance $d_e$, a length $d_l$, and a thickness $d_h$. The edge portion 70 may be disposed in the mold cavity 40 at a distance $d_w$ from the upper or lower walls 53, 43 of the cavity 40. Preferably $d_w$ is at least about 20% of the cavity height 54 at any point on the side surface 32 of the substrate 30, more preferably at least about 15%, and most preferably about 10%.

In another preferred aspect of the inventive method, distance $d_e$ may be at most about 0.75 times the cavity width 56, more preferably about 0.50, and length $d_l$ may be at least about 2 times the cavity width 56, more preferably 3 times the cavity width 56 or more, and thickness $d_h$ may be at most about 0.85 times the cavity height 57, more preferably about 0.75 times.

In yet another preferred aspect of the inventive method, the thickness $d_h$ may be from about 1.0 to 5.0 mm, more preferably from about 2.0 to 5.0 mm, and most preferably from about 2.5 to 4.5 mm. Furthermore, the distance $d_e$ may be from about 1.0 to 15.0 mm, more preferably about 2.0 to 12.0 mm, most preferably from about 2.0 to 10.0 mm.

Not to be bound by theory—but we believe the following to be true.

The polymer pressure at the flow front, when it first touches any edge portion of the projecting substrate (e.g. edge portion

70), is zero. Because the approximate force required to bend the laminate so that it is no longer in the middle of the melt can be as high as 1400 KPa, or as low as 10 KPa (for our laminate systems), the pressure gradient of the flowable polymer across the laminate, before significant viscosity increase of the polymer takes place, can not exceed this pressure. Once significant viscosity increase begins, the force required to bend the edge portion of the laminate is increased as a result of part being supported by the higher viscosity of the polymer. So, in the following paragraph, flowable polymer means the flow stream prior to the time significant increase of the viscosity of the polymer melt occurs.

It is contemplated that the pressure gradient of the flowable polymer above and below the edge portion should be less than about 1400 KPa, (200 psi) more preferably less than 700 KPa (100 psi) and still more preferably less that 140 KPa (20 psi), and most preferably very near to zero. It is also contemplated that the flowable polymer may have a viscosity of less than about 150 Pa-s at 10,000 $\sec^{-1}$ as measured by ASTM D3835-2002, more preferably less than about 100 Pa-s, and most preferably less than about 50 Pa-s.

Examples of preferred flowable polymers include Acrylonitrile copolymers, polypropylenes, polyethylene, Vinyl based resins, polycarbonate polymers, styrenic polymers (styrene acrylonitrile copolymers, polystyrene, styrene-butadiene rubber copolymers), thermoplastic urethane polymers, thermoplastic elastomers (TPO, TPE, TPR), polyamides, silicones, urethanes, and epoxies.

As shown in FIG. 6, the closed mold cavity 40 with the edge portion 70 in place may also be described as having a clear zone 80 and a substrate zone 90. During the injection of the flowable polymer, a polymer flow 100 though the cavity is created, see FIG. 5. The forward edge (e.g. front surface 110 or flow front) of the polymer flow 100 preferably may at least partially fills the clear zone 80 before filling the substrate zone 90. As shown in FIG. 5, the front surface 110 of the polymer flow (direction shown by ➡) may flow at an angle α relative to the clear zone 80 and the substrate zone 90. In a preferred aspect of the inventive method, angle α has a value between about 2° and 75°, more preferably between about 3° and 70° and most preferably between about 5° and 60°. It is believed that if α is greater than 75° degrees, pressure gradients will increase prior to encapsulation of the edge portion 70 of the substrate 30, with the said pressure gradients eventually resulting in forces that cause the edge portion 70 to move to the inner walls 54, 44 of the cavity 40. It is believed that these angles may not be not absolute as they are dependent on the substrate stiffness and pressure gradients result of polymer flow and viscosity.

EXAMPLE

As one non-limiting example of the inventive method, the following steps are contemplated:

A method of producing an over-molded article may include the steps of: a) providing a substrate to be over-molded, wherein the substrate has a Young's modulus of 150 MPa to 1500 MPa (10,000 psi to 10 MM psi with a preferred range of 400M psi to 500 Mpsi), has an upper surface, lower surface, and a side surface connecting the upper and lower surface, and a centerline equidistant from the upper and lower surfaces; b) providing a mold with a mold cavity including a first and a second section defining a cavity, the mold cavity having an upper wall, a lower wall and an inner and outer side wall interconnected therebetween, a cavity height defined by the distance between the upper wall and the lower wall, wherein the mold is essentially void of any nesting device inside the mold cavity to support the substrate; c) placing and aligning an edge of the substrate onto the first section of the mold cavity such that an edge portion of the substrate, defined by a distance de, a length dl, and a thickness dh, is disposed within the mold cavity and the edge portion is disposed in the mold cavity at a distance dw from the upper or lower walls, wherein dw is at least 10% of the cavity height at any point on the side surface of the substrate; d) closing the second section of the mold cavity, sandwiching the substrate therebetween, wherein the edge portion of the substrate is unsupported and protrudes into the mold cavity; e) injecting a flowable polymer into the mold cavity creating a polymer flow until the cavity is substantially filled with the flowable polymer and the edge portion is entirely sealed by the polymer; f) holding the mold closed until the polymer solidifies; g) opening the mold sections; and h) removing the over-molded article.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" to describe combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

ELEMENT NUMBERS

20 Over-molded article
30 Substrate
32 Side surface
40 Mold Cavity
42 First section
43 Lower wall
44 First inner wall
45 First outer wall
52 Second Section
53 Upper wall
54 Second inner wall
55 Second outer wall
57 Cavity height
56 Cavity width
60 Mold
62 Projection
70 Edge portion
80 Clear zone
90 Substrate zone
100 Polymer flow
110 Front surface

What is claimed is:

1. A method of producing an over-molded article comprising the steps of:
   a) providing a substrate to be over-molded, wherein the substrate has a Young's modulus of 150 MPa to 1500 MPa, has an upper surface, lower surface, and a side surface connecting the upper and lower surface, and a centerline equidistant from the upper and lower surface;
   b) providing a mold with a mold cavity including a first and second section defining a cavity, the mold cavity having an upper wall, a lower wall and an inner and outer side wall interconnected therebetween, a cavity height defined by the distance between the upper wall and the lower wall, wherein the mold is essentially void of any nesting device inside the mold cavity to support the substrate and the mold cavity is further defined to have a clear zone and a substrate zone;
   c) placing and aligning an edge of the substrate onto the first section of the mold cavity such that en edge portion of the substrate, defined by a distance $d_e$, a length $d_l$, and a thickness $d_h$, is disposed within the mold cavity and the edge portion is disposed in the mold cavity at a distance $d_w$ from the upper or tower walls, wherein $d_w$ is at least 10% of the cavity height at any point on the side surface of the substrate;
   d) closing the second section of the mold cavity, sandwiching the substrate therebetween, wherein the edge portion of the substrate is unsupported and protrudes into the mold cavity;
   e) injecting a flowable polymer into the mold cavity creating a polymer flow until the cavity is substantially filled with the flowable polymer and the edge portion is entirely sealed by the polymer, the polymer flow is further defined as having a flow front, wherein the flow front at least partially fills the clear zone before filling the substrate zone and a front surface that is angled between the clear zone and substrate zone at an angle $\alpha$, wherein $\alpha$ has value between about 5° and 60°, and a pressure gradient of the flowable polymer above and below the edge portion is less than what is required to force the edge portion to either of the cavity walls;
   f) holding the mold closed until the polymer solidifies;
   g) opening the mold sections; and
   h) removing the over-molded article.

2. The method according to claim 1 wherein the mold cavity is defined by a cavity width which is the distance from the inner end outer side walls, a cavity height, and a cavity length.

3. The method according to claim 2, wherein distance $d_e$ at most 0.5 times the cavity width and length $d_l$ is at least 2 times the cavity width and thickness $d_h$ is at most 0.75 times the cavity height.

4. The method according to claim 1, wherein the thickness $d_h$ is from about 1.0 to 5.0 mm.

5. The method according to claim 1, wherein the distance $d_e$ is tree about 2.0 to 10.0 mm.

6. The method according to claim 1, wherein the lieu able polymer has a viscosity of less than 150 Pa-s at 10,000 sec-1 as measured by ASTM D3835-2002.

7. The method according to claim 1, wherein the mold includes a projection.

8. The method according to claim 1, wherein the pressure gradient is less than 1400 KPa.

* * * * *

UNITED STATES PATENT AND TRADEMARK OFFICE
CERTIFICATE OF CORRECTION

PATENT NO. : 8,377,358 B2  
APPLICATION NO. : 12/989747  
DATED : February 19, 2013  
INVENTOR(S) : James R. Kennihan et al.

Page 1 of 1

It is certified that error appears in the above-identified patent and that said Letters Patent is hereby corrected as shown below:

In the Claims:

Column 9, Claim 1, Line 50, "surface;" should be "surfaces"  
Column 10, Claim 1, Line 11, "tower" should be "lower"  
Column 10, Claim 3, Line 37, insert --is-- after "$d_e$"  
Column 10, Claim 5, Line 44, "tree" should be "from"  
Column 10, Claim 6, Line 45, "lieu able" should be "flowable"

Signed and Sealed this  
Twenty-third Day of April, 2013

Teresa Stanek Rea  
*Acting Director of the United States Patent and Trademark Office*